United States Patent
Rehwald et al.

(10) Patent No.: US 8,947,086 B2
(45) Date of Patent: Feb. 3, 2015

(54) METHOD AND DEVICE TO GENERATE SPATIALLY RESOLVED QUASI-T2-WEIGHTED MAGNETIC RESONANCE SIGNALS

(75) Inventors: Wolfgang G. Rehwald, Chapel Hill, NC (US); Peter Speier, Erlangen (DE)

(73) Assignees: Siemens Aktiengesellaschaft, Munich (DE); Siemens Medical Solutions USA, Inc., Malvern, PA (US)

( * ) Notice: Subject to any disclaimer, the term of this patent is extended or adjusted under 35 U.S.C. 154(b) by 484 days.

(21) Appl. No.: 13/435,218

(22) Filed: Mar. 30, 2012

(65) Prior Publication Data

US 2012/0249144 A1    Oct. 4, 2012

(30) Foreign Application Priority Data

Mar. 31, 2011    (DE) .......................... 10 2011 006 577

(51) Int. Cl.
*G01V 3/00*    (2006.01)
*G01R 33/561*    (2006.01)
*G01R 33/563*    (2006.01)

(52) U.S. Cl.
CPC .......... *G01R 33/5614* (2013.01); *G01R 33/563* (2013.01)
USPC .......................................... 324/309; 324/306

(58) Field of Classification Search
USPC .......................... 324/309, 307, 306, 312, 314
See application file for complete search history.

(56) References Cited

U.S. PATENT DOCUMENTS

| | | | | |
|---|---|---|---|---|
| 7,576,535 B2 * | 8/2009 | Hargreaves | ................... | 324/307 |
| 8,159,221 B2 * | 4/2012 | Yui | ................... | 324/307 |
| 8,212,561 B2 * | 7/2012 | Nielsen et al. | ................ | 324/309 |
| 8,248,069 B2 * | 8/2012 | Buracas | ....................... | 324/307 |
| 8,269,494 B2 * | 9/2012 | Lee et al. | ...................... | 324/309 |
| 2003/0189425 A1 | 10/2003 | Le Roux | | |

OTHER PUBLICATIONS

"Analysis of Multiple-Acquisition SSFP," Bangerter et al., Magnetic Resonance in Medicine, vol. 51 (2004), pp. 1038-1047.
"T2 Quantification for Improved Detection of Myocardial Edema," Giri et al., Journal of Cardiovascular Magnetic Resonance, vol. 11, No. 56 (2009), pp. 1-13.

(Continued)

*Primary Examiner* — Louis Arana
(74) *Attorney, Agent, or Firm* — Schiff Hardin LLP

(57) ABSTRACT

In a magnetic resonance method and device to generate spatially resolved, quasi-T2-weighted magnetic resonance signals from an examination region, an initial magnetization is flipped in a first direction with a first gradient-balanced SSFP sequence. Spatially coded first magnetic resonance signals from the first gradient-balanced SSFP sequence are detected during the transient portion of the first SSFP sequence. An initial magnetization is flipped in a direction opposite the first direction with a second gradient-balanced SSFP sequence. Spatially coded second magnetic resonance signals from the second gradient-balanced SSFP sequence during the transient portion of the second gradient-balanced SSFP sequence. The first and second magnetic resonance signals are constructively superimposed into overlay signals. Image data with a predominant T2 weighting are reconstructed from the overlay signals, or are used for spatially resolved estimation of the T2 relaxation time constant.

14 Claims, 6 Drawing Sheets

(56) References Cited

OTHER PUBLICATIONS

"T2-Prepared SSFP Improves Diagnostic Confidence in Edema Imaging in Acute MI Compared with Turbo-SpinEcho," Kellman et al., Magnetic Resonance in Medicine, vol. 57 (2007), pp. 891-897.

"Balanced Steady State Free Precession fMRI," Lee, Journal of Imaging Systems Technology, vol. 20 (2010), pp. 23-30.

"ACUT$_2$E TSE-SSFP: a Hybrid Method for T2-Weighted Imaging of Edema in the Heart," Aletras et al., Magnetic Resonance in Medicine, vol. 59 (2008), pp. 229-235.

"Flow Compensation in Balanced SSFP Sequences," Bieri et al., Magnetic Resonance in Medicine, vol. 54 (2005), pp. 901-907.

"High-Resolution Study of NMR Spin Echoes: 'J Spectra'", Freeman et al., Journal of Chemical Physics, vol. 54, No. 1 (1971), pp. 301-313.

"Spin Dynamics of Carr-Purcell-Meiboom-Gill-Like Sequences in Grossly Inhomogeneous $B_o$ and $B_1$ Fields and Application to NMR Well Logging," Hürlimann et al., Journal of Magnetic Resonance, vol. 143 (2000), pp. 120-135.

"Modified Spin-Echo Method for Measuring Nuclear Relaxation Times," Meiboom et al., Review of Scientific Instruments, vol. 29, No. 8 (1958), pp. 688-691.

\* cited by examiner

METHOD AND DEVICE TO GENERATE SPATIALLY RESOLVED QUASI-T2-WEIGHTED MAGNETIC RESONANCE SIGNALS

BACKGROUND OF THE INVENTION

1. Field of the Invention

The invention concerns a method to generate spatially resolved, quasi-T2-weighted magnetic resonance signals, as well as a device to implement such a method. Either quasi-T2-weighted image data are then estimated from the quasi-T2-weighted magnetic resonance signals, or the T2 relaxation constant is estimated with spatial resolution.

2. Description of the Prior Art

Magnetic resonance imaging has found broad application in the medical field. One of the advantages is an excellent contrast in the imaging of different tissue types and even bodily fluids. The contrast response is determined by the varying longitudinal and transverse relaxation constants T1 and T2 and T2* of the different tissue types and body fluids, as well as by the sequence type used for signal acquisition and the repetition time TR and echo time TE that can be set.

In recent times, edema imaging of the heart has gained increasing clinical importance. For example, edema imaging allows a fresh infarct to be characterized. In magnetic resonance imaging, an edema in the myocardium is characterized by extended longitudinal and transverse relaxation constants T1 and T2 relative to healthy myocardium. Edema imaging is concerned primarily with utilizing this extension in order to optimize the contrast. Since the myocardium moves and there are only short periods of relative rest in the cardiac cycle, the measurement method must be fast and robust with regard to movement.

Two different sequence types have previously been used for edema imaging. In both sequence types, a triggered signal acquisition in a segmented raw data matrix takes place over multiple heart beats in the respective phases of relative rest in each cardiac cycle. In this case, k-space or the raw data matrix is segmented corresponding to the number of cardiac cycles used for signal acquisition.

In principle, the use of a turbo spin echo sequence (TSE sequence) with a T2-weighted reordering is suggested as a first sequence type. However, the TSE sequence is relatively susceptible to movement.

The second sequence type that is used is a Trufi sequence. The Trufi method represents a balanced Steady State Free Precession (bSSFP) sequence. In a first variant, the Trufi sequence is incorporated into a hybrid method and uses a T2 preparation module. The subsequent signal acquisition takes place according to the Trufi method. In a second variant, the Trufi signal acquisition takes place after excitation with a 180° pulse series. This hybrid method is described in the article by Aletras et al.: "ACUT$_2$E TSE-SSFP: A Hybrid Method for T2-Weighted Imaging of Edema in the Heart", Magnetic Resonance in Medicine (2008), Vol. 59, Pages 229-235. A T2-weighted representation of the myocardium can be generated with this method. The signal-to-noise ratio and the contrast-to-noise ratio in the myocardium are similar to those in a TSE sequence. This hybrid method places high demands on the capacity of the radio-frequency transmitter and causes a high SAR exposure for the patient. The application of this hybrid sequence is limited because the T2 preparation pulse is susceptible to inhomogeneities of the basic magnetic field. The Trufi signal acquisition additionally generates a transient contrast: the optimal edema contrast at the beginning of the sequence transitions over the course of the signal acquisition (given a steady state) to a contrast that is determined by T1 and T2, more precisely by the quotient T1/T2. In order to keep the contributions of the unwanted T1 contrast as small as possible, it is sought to use a flip angle of 180° after the first excitation.

The T2 contrast response of CPMG-like sequences is described in the article by M. D. Hürlimann and D. D. Griffin entitled "Spin Dynamics of Carr-Purcell-Meiboom-Gill-like Sequences in Grossly Inhomogeneous B0 and B1 Fields and Application to NMR Well Logging", in the Journal of Magnetic Resonance (2000), Volume 143, pages 120 to 135.

SUMMARY OF THE INVENTION

An object of the invention is to provide a magnetic resonance method to generate spatially resolved, quasi-T2-weighted magnetic resonance signals that is insensitive to movements of the area to be imaged.

An object of the invention is to provide a device with which spatially resolved, quasi-T2-weighted magnetic resonance signals can be generated from moving imaging regions.

The above object is achieved in accordance with the invention by a method to generate spatially resolved, quasi-T2-weighted magnetic resonance signals from an examination region with a first gradient-balanced SSFP sequence (bSSFP sequence), wherein an initial magnetization is generated having a longitudinal direction component in a first direction, wherein spatially coded first magnetic resonance signals from the first gradient-balanced SSFP sequence are detected during the transient portion of the first SSFP sequence, and with a second gradient-balanced SSFP sequence, wherein an initial magnetization is generated having a longitudinal direction component in a direction opposite the first direction, wherein spatially coded second magnetic resonance signals from the second gradient-balanced SSFP sequence are detected during the transient portion of the second SSFP sequence. The second gradient-balanced SSFP sequence is of the same sequence type as the first gradient-balanced SSFP sequence; and wherein the first and second magnetic resonance signals are constructively superimposed into overlay signals. The overlay signals are additionally processed into image data with a predominant T2 weighting, or for spatially resolved estimation of the T2 relaxation time constant. Artifacts due to a movement of the imaging area can therefore be reduced given a quasi-T2-weighted data acquisition.

It should be noted that pure T2-weighted overlay signals cannot be generated with this method under all conditions. Under the circumstances, a small (but in practice negligible) portion that is determined by the T1 relaxation constant is still present in the overlay signals. This contrast response is designated by the use of the term "quasi".

The algebraic sign of the steady state can be inverted relative to the usable signal via a phase cycle in the radio-frequency signal; this method is designated as PAP (phase alternated pair) NMR spectroscopy. According to the invention, the direction of the longitudinal component of the magnetization and/or the phase position of the measurable magnetic resonance signal in the two SSFP sequences are now varied via a phase cycle so that, given a constructive signal superimposition, the portion determined by the longitudinal relaxation disappears in the overlay signal. The signal curve is practically a pure T2 decay. Only for extreme inhomogeneities does the decay still also contain noticeable T1 contributions. However, these regions are normally located outside of the imaging area and can therefore be ignored. Given edemas, the extension of the transversal relaxation constant T2 can therefore advantageously be converted into an improved visibility.

The Trufi signal is significantly less motion-sensitive than the signal of a TSE sequence. This is due to the fact that, in contrast to the TSE sequence, the gradients of the Trufi sequence are completely balanced, meaning that the gradient time area is zero at the point in time of each excitation/refocusing, i.e. in the temporal middle of the excitation or refocusing pulse on each gradient axis. In fact, the Trufi sequence can be understood as a Carr-Purcell-Freeman-Hill sequence (CPFH sequence). The CPFH sequence has approximately the same signal properties with regard to movement susceptibility, relaxation response and signal development as the Carr-Purcell-Meiboom-Gill sequence (CPMG sequence). The CPMG sequence can therefore also be viewed as a variant of the CPFH sequence with regard to the radio-frequency phase cycling. The CPMG sequence is described by S. Meiboom and D. Gill in Rev. Sci. Instrum., August 1958, Volume 29, Nr. 8, Pages 688-691. The CPFH sequence is described by R. Freeman and H. D. Hill in J. Chem. Phys., January 1971, Volume 54, Nr. 1, pages 301 to 313.

The invention also encompasses a device that is designed to implement the method according to the invention. The device has an MR data acquisition unit that is operable by a control unit to generate a first gradient-balanced SSFP sequence with which an initial magnetization is generated having a longitudinal component in a first direction and to detect spatially coded first magnetic resonance signals from the first gradient-balanced SSFP sequence during the transient portion of the first SSFP sequence. The data acquisition unit is operable to generate a second gradient-balanced SSFP sequence of the same sequence type as the first gradient-balanced SSFP sequence, with which an initial magnetization is generated having a longitudinal component in a direction opposite the first direction. The data acquisition unit is operable to detect spatially coded second magnetic resonance signals from the second gradient-balanced SSFP sequence during the transient portion of the second gradient-balanced SSFP sequence. A processor (which may be the same as the control unit) is configured to constructively superimpose the first and second magnetic resonance signals into overlay signals; and to additionally process the overlay signals into image data with a prevailing T2 weighting, or for spatially resolved estimation of the T2 relaxation time constant.

In an embodiment of the invention, the first direction of the longitudinal component of the initial magnetization in the first bSSFP sequence is produced by a first preparation pulse, and the second direction of the longitudinal component of the initial magnetization in the second bSSFP sequence is produced by a second preparation pulse, and excitation pulses following the preparation pulses are identical in both bSSFP sequences. The two bSSFP sequences therefore differ only in the preparation pulse; the signal acquisition itself is the same, and therefore the signal response is as well.

The two SSFP sequences can be realized either as CPMG or CPFH sequences.

In particular, the use of the CPFH sequence (realized with a Trufi sequence) allows small flip angles, in view of the low SAR exposure associated with this sequence, long readout and T2 preparation times are allowed. Shorter echo intervals or lower readout bandwidths that result in a higher signal-to-noise ratio are similarly possible. This in turn enables the application of the method according to the invention with basic magnetic field strengths of 3 Tesla and more. Even longer T2 contrast preparation times are therefore possible in order to optimize the contrast response.

Alternatively, in both the CPFH sequence and in the CPMG sequence the second SSFP sequence can be generated from the first SSFP sequence by introducing a 180° inversion pulse with subsequent spoiler. This is then an inversion recovery SSFP sequence with minimal inversion time. This alternative is particularly interesting in the event that the flip angle is a great deal smaller than 180®

The signal acquisition (which is already inherently fast) can be further accelerated if half-Fourier and/or partially parallel acquisition techniques (PPA techniques) are used.

In cine imaging with Trufi it has been shown that the Trufi signal can also be conserved across the contraction phase of the heart. In order to achieve a stronger T2 weighting, and in order to possibly avoid transient artifacts, the sequence can be started earlier in the cardiac cycle, even already in the movement phase. The signal acquisition is then begun after achieving a sufficient or desired T2 weighting.

Since the signal acquisition already takes place in the transient part of the SSFP sequence—thus before the magnetic resonance signal has reached the stationary steady state—the signal varies during the echo readout. Artifacts in the combination of multiple partial measurements can be avoided if the entirety of k-space is covered in each partial measurement. Given high acceleration factors (PAT factors) in the partially parallel acquisition technique, or also given stronger segmentation of k-space (i.e. the distribution of the acquired magnetic resonance signals among many cardiac cycles), k-space is scanned in large jumps that are typically equidistant. Given balanced SSFP sequences, this leads to flow and eddy current artifacts. These can in turn be reduced via the application of the "pairing" principle as it was described by O. Bieri and K. Scheffler in the article "Flow compensation in balanced SSFP sequences", in Magnetic Resonance in Medicine, Volume 54, Issue 4, on Pages 901 to 907 (2005).

DESCRIPTION OF THE PREFERRED EMBODIMENTS

Figure 1:
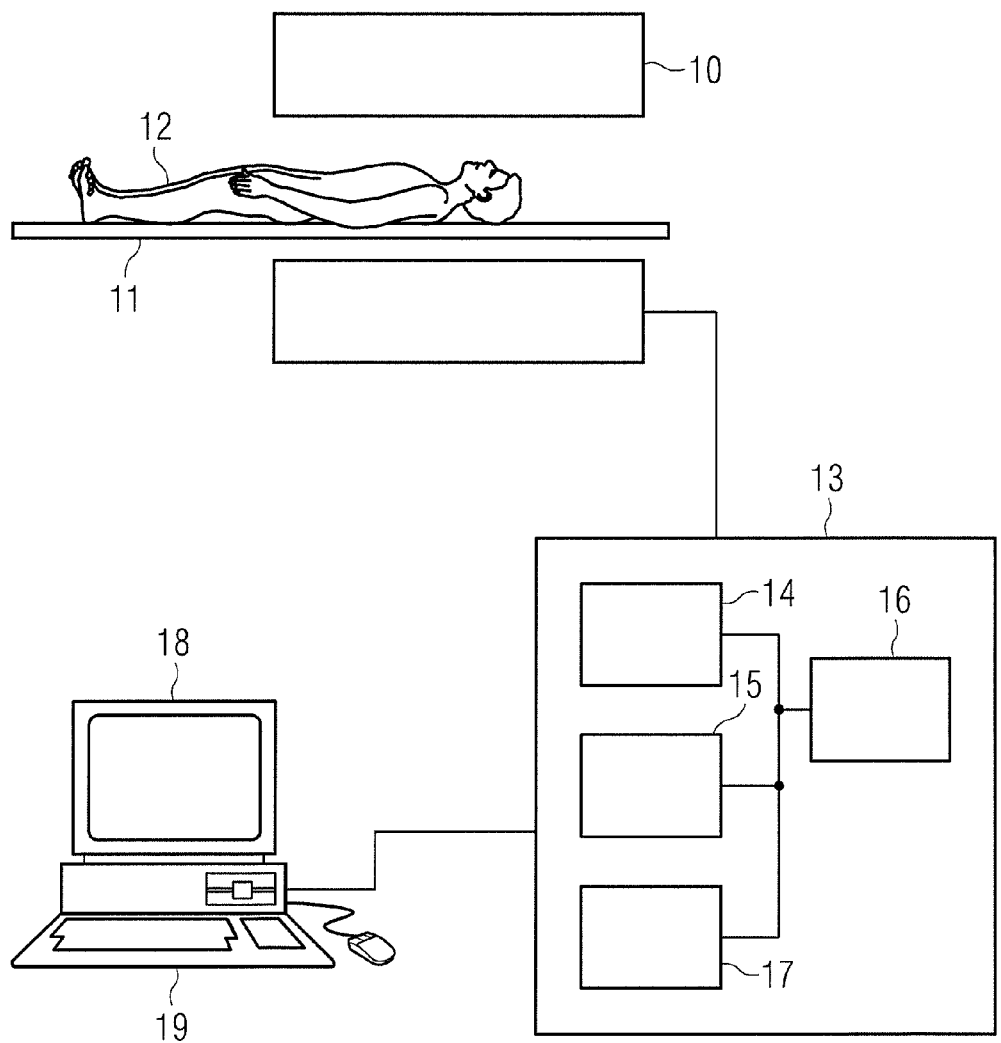
FIG. 1 schematically illustrates the basic components of a magnetic resonance apparatus suitable to implement the invention.

In FIG. 1 a magnetic resonance apparatus is schematically shown with which spatially resolved, quasi-T2-weighted magnetic resonance signals of a moving subject (of the heart, for example) can be generated. The magnetic resonance apparatus has a magnet 10 to generate a polarization field $B_0$, wherein an examined person 12 borne on a bed 11 is moved into the center of the magnet 10 in order to acquire the quasi-T2-weighted magnetic resonance signals there. The magnetization generated by the polarization field $B_0$ can be deflected by radiating radio-frequency pulse series and switching magnetic field gradients, wherein magnetic resonance signals are induced in reception coils (not shown). The general operation for generating magnetic resonance signals with various acquisition sequences is known to those skilled in the art, so a detailed explanation of the individual apparatus components is not necessary herein. The magnetic resonance apparatus furthermore has a central control unit 13 that is used to control the magnetic resonance apparatus and that has a radio-frequency control unit 14, a magnetic field gradient control unit 15 and a sequence control unit 16 that controls the sequence of the radiated radio-frequency pulses and the switching of magnetic field gradients depending on the desired signal contrast and the set acquisition sequence. As is generally known, an image computer 17 calculates magnetic resonance images or also various spatially resolved characteristics of the examined subject (for example the T2 relaxation constant) from the detected magnetic resonance signals. The anatomical information or the characteristics as well are displayed with accurate spatial characteristics on a display unit 18 of the magnetic resonance apparatus. The magnetic resonance apparatus can be controlled by an operator via an operating unit 19.

In addition to the flip angle, the contrast response of pulse sequences is determined by the selection of the echo time TE and the repetition time TR. In the case of gradient echo sequences, the signal acquisition should thus follow as promptly as possible after the radio-frequency excitation so that no signal loss takes place due to a dephasing of the transversal magnetization in inhomogeneities of the basic magnetic field $B_0$.

However, it is often desirable to be able to apply a longer readout delay so that a signal contrast develops due to different transversal relaxation times in the examination area. In general, a spin echo sequence with a 180° refocusing pulse is then used with which the dephased nuclear spins are rephased again.

The repeated application of 180° pulses in a sequence enables the generation of multiple images of a slice with different T2 emphasis after an excitation, from which images the local transversal relaxation times can then be calculated.

The repeated application of 180° pulses in the TSE sequence also is used in order to shorten the measurement time for a single image. The contrast is then determined from the echo time in which the low spatial frequencies are measured and the coarse structure of the subject is scanned.

The T2 relaxation times are extended for many pathological tissues, thus for cysts, edemas, tumors, inflammations, demyelinations. In most cases, an extension of T1 is incurred with this T2 extension. Since the achievable T2 contrasts are larger, however, sequences with long TR and long TE are normally the most sensitive to these variations. The long echo times emphasize the T2 differences; long repetition times should decrease influence of the T1 differences since otherwise intersection points that deliver no contrast occur in the signal response. A sequence that generates either a quasi-pure T2 contrast or a mixed contrast of T2 and T1 is thus advantageous to depict this tissue variation with positive contrast, wherein the signal brightness must increase with increasing T1 and T2. The measurement sequence according to the invention provides this.

Figure 2:
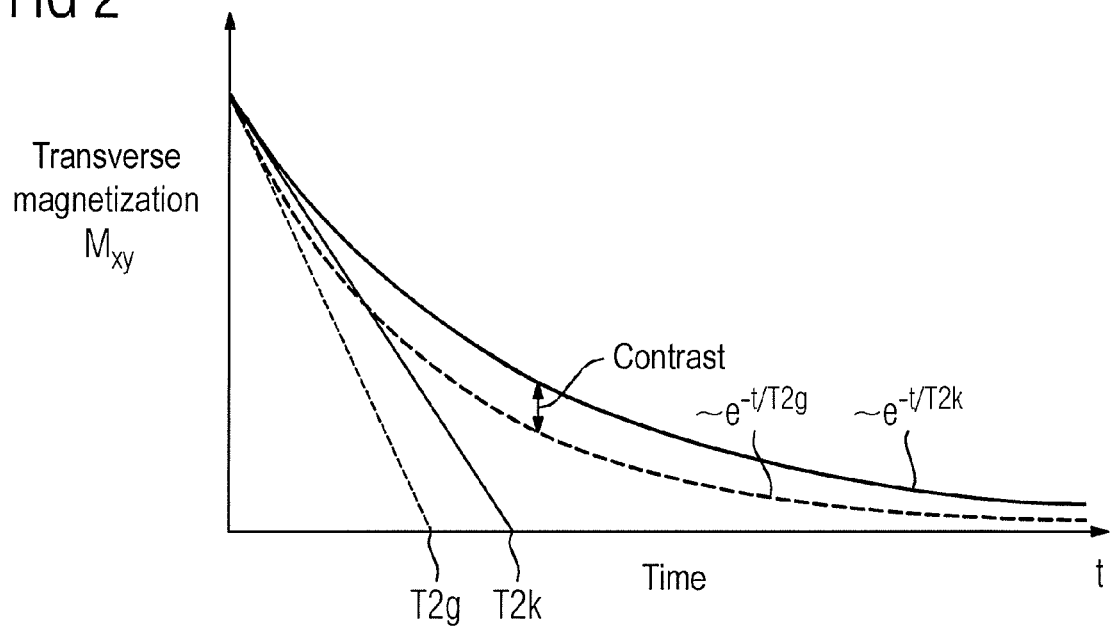
FIG. 2 shows the contrast response of tissue or bodily fluids with various T2 relaxation constants.

In a rotating coordinate system as is typical in magnetic resonance engineering, FIG. 2 shows the fundamental signal response of the transverse magnetization $M_{xy}$ over time given healthy tissue with a relaxation constant T2g and given pathological tissue with an extended relaxation time constant T2k. The transverse magnetization $M_{xy}$ decays according to an e-function. In FIG. 2 it is apparent that varying signal intensities also develop in pathological and healthy tissue at various points in time of the signal acquisition. The good visibility resulting from the differences of the signal intensities is utilized in the assessment of the magnetic resonance images.

Figure 3:
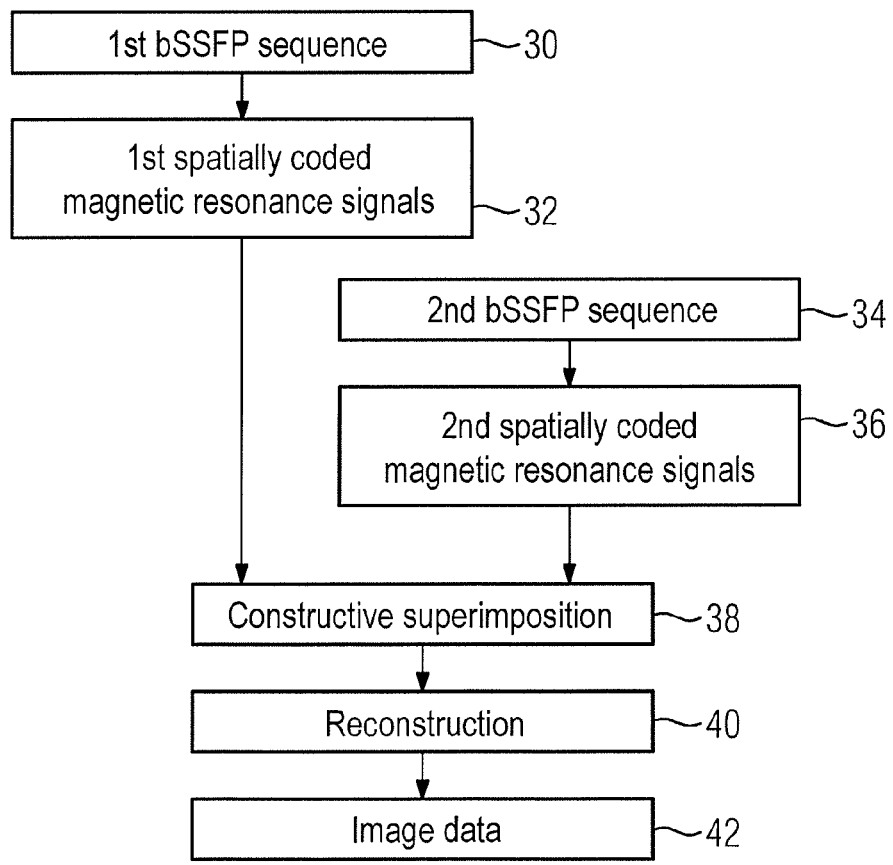
FIG. 3 is a basic flowchart of an embodiment of the inventive method to generate T2-weighted magnetic resonance signals.

FIG. 3 shows the workflow (with the essential method steps) of an embodiment of the method to generate quasi-T2-weighted magnetic resonance signals with a balanced SSFP or bSSFP sequence.

In the first method step 30, a first bSSFP sequence runs in the magnetic resonance apparatus. First spatially coded magnetic resonance signals 32 from a predetermined imaging area are generated with the first bSSFP sequence. The first bSSFP sequence is designed such that it generates an initial magnetization whose longitudinal component points in a first direction. In the second method step 34, a second bSSFP sequence runs in the magnetic resonance apparatus, with which second bSSFP sequence second spatially coded magnetic resonance signals 36 are generated of the same imaging area as with the first bSSFP sequence. The second bSSFP sequence is designed such that it generates an initial magnetization whose longitudinal component points in a second direction that points counter to the first direction. The first and second bSSFP sequence are thereby of the same sequence type. The respective first and second spatially coded magnetic resonance signals 32 and 36 are then constructively superimposed in the method step 38. The constructive overlaying 38 occurs by addition of the first and second magnetic resonance signals 32 and 36 if the first and second magnetic resonance signals 32 or, respectively, 36 are in phase. The constructive overlaying 38 takes place by means of a subtraction if the first and second magnetic resonance signals 32 and 36 are in antiphase. The result of the constructive overlay 38 is called overlay signals in the following. The overlay signals are predominantly only T2-weighted. The overlay signals are then reconstructed in method step 40 by means of a Fourier transformation in image data 42. The image data 42 can then be displayed or stored in order to be processed further or displayed again later.

Details with regard to the bSSFP pulse sequences and the magnetizations that are generated with these should now be described as an example using the following Figures.

Figure 4:
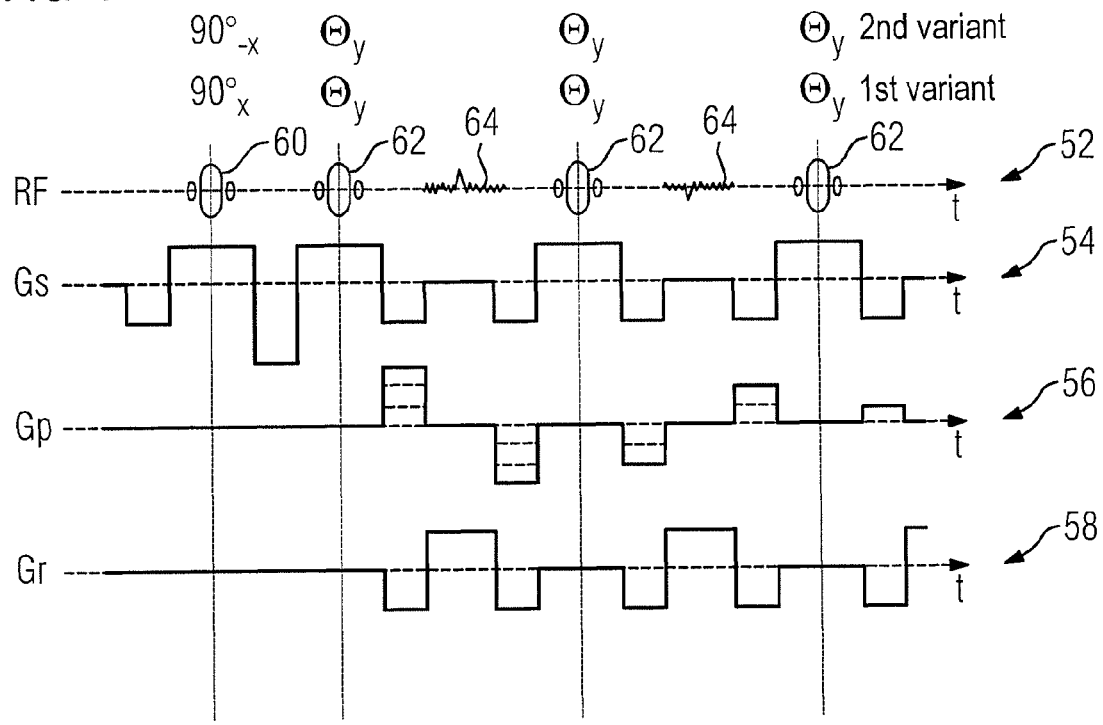
FIG. 4 shows in a time diagram, the sequence of excitation and gradient pulses of a turbo spin echo sequence (TSE sequence) to generate the first and second magnetic resonance signals.

FIG. 4 shows over time an exemplary embodiment of a first pulse sequence type with the characteristic pulse curves of radio-frequency and gradient pulses to generate the magnetic resonance signals according to the invention. A Carr-Purcell-Meiboom-Gill sequence (CPMG sequence) is applied as a first sequence type. The CPMG sequence can also be regarded as a turbo spin echo sequence with regard to the radio-frequency phase cycle. The axis for the radio-frequency signals RF is designated with the reference character 52; the axis of the slice selection gradient Gs is designated with 54; the axis of the phase coding gradient Gp is designated with 56; and the axis of the readout gradient Gr is designated with 58.

The basic steps of a CPMG sequence is known and are described herein only for a better comprehension. After a 90° radio-frequency excitation pulse 60, refocusing pulses 62 are continuously radiated into the imaging area. The refocusing pulses 62 produce an additional flipping of the magnetization by a defined angle θ that advantageously amounts to 180°. Between the refocusing pulses 62, magnetic resonance signals 64 are then received that are spatially coded in a known manner by means of the gradient pulses 54, 56, 58. The spatial coding of the magnetic resonance signals to generate slice image data (2D data) is presently shown as an example.

The radio-frequency pulses 60 and 62 are radiated with a defined direction in order to generate the desired direction of the longitudinal component in the initial magnetization, and therefore also the desired signal response. In the present example, in the first bSSFP sequence (1st variant) the 90° excitation pulse 60 is generated in the x-direction and the refocusing pulses 62 are generated in the y-direction of the z-direction of the spatial coordinate system points in the direction of the basic magnetic field $B_0$. In the second bSSFP sequence (2nd variant), the radiation of the 90° excitation pulse 60 takes place in the negative x-direction. The radiation direction of the refocusing pulses 62 is the same as in the y-direction given the first bSSFP sequence. This is likewise additionally indicated in FIG. 4 at the radio-frequency pulses 60, 62.

Figure 5:
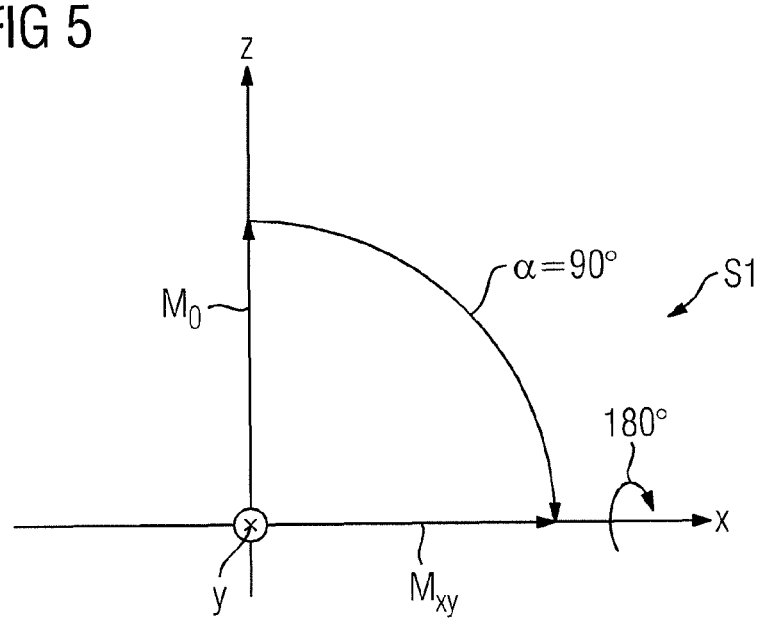
FIG. 5 shows the various spatial attitudes of the magnetization vector for a TSE sequence with a first preparation pulse.

FIG. 5 illustrates the phase position of the magnetization vector after the first 90° excitation pulse 60 in the first bSSFP sequence (1st variant) according to FIG. 4. The z-direction is in turn the direction of the basic magnetic field $B_0$. The magnetization $M_0$ is flipped in the xy-plane and is initially provided entirely as a transversal magnetization $M_{xy}$. The following refocusing pulses 62 rotate the magnetization vector continuously around the y-axis until the magnetization has decayed due to the spin-spin relaxation.

Figure 6:
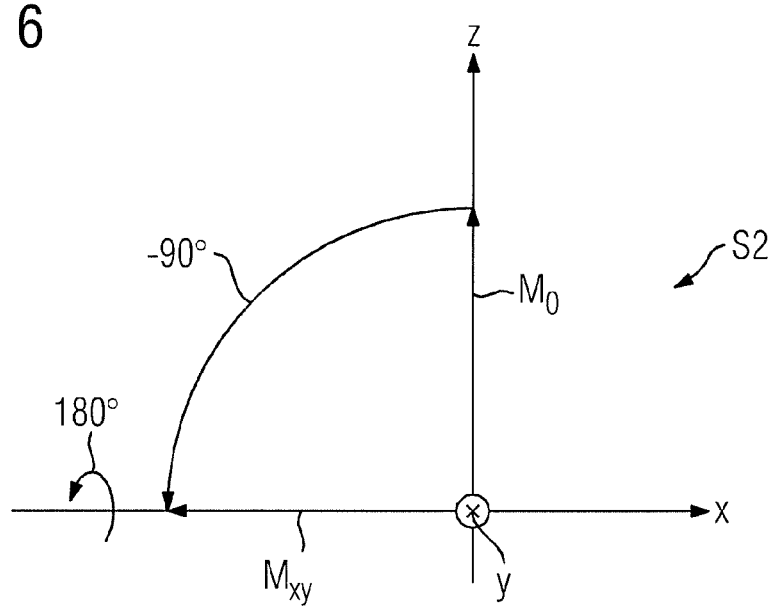
FIG. 6 shows the various spatial attitudes of the magnetization vector for a TSE sequence with a second preparation pulse.

Analogously to FIG. 5, FIG. 6 shows the magnetization for the second bSSFP sequence (2nd variant) according to FIG. 4. Here the initial magnetization is flipped in the negative x-direction with the first 90° excitation pulse 60 and is subsequently likewise continuously rotated around the y-axis by means of the refocusing pulses 62.

As is easily apparent using FIGS. 5 and 6, the constructive superimposition takes place via subtraction in the present example.

Figure 7:
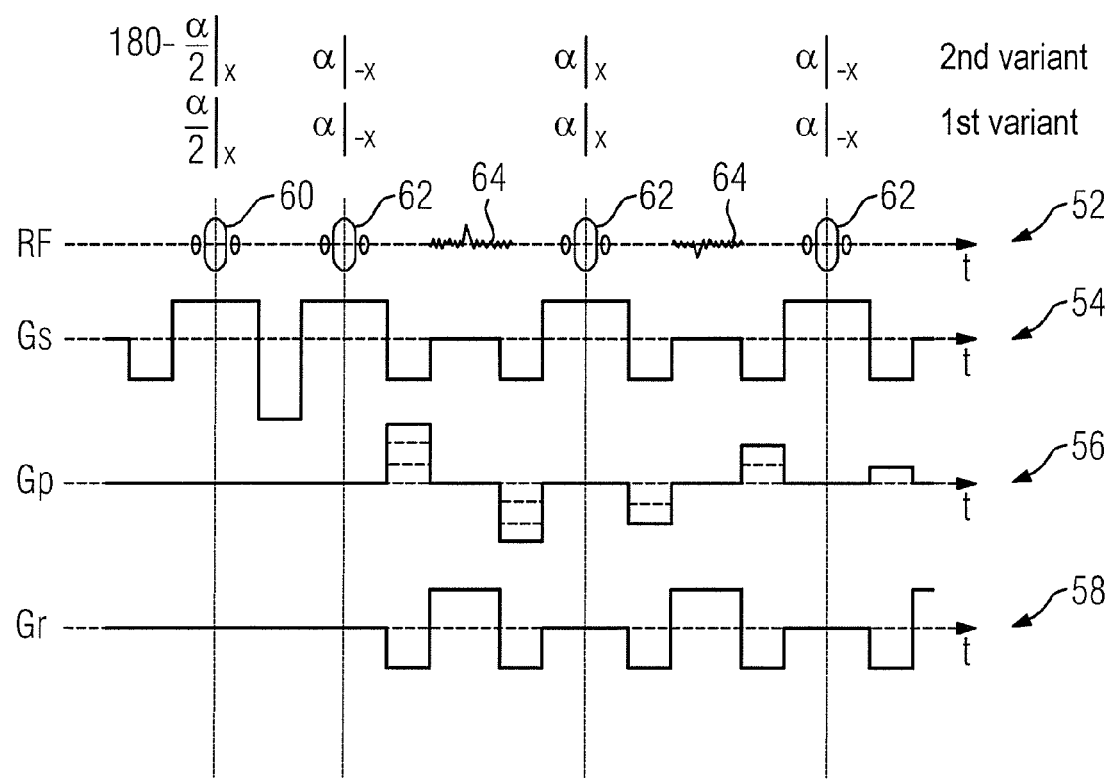
FIG. 7 shows, in a time diagram, the sequence of excitation and gradient pulses for a Trufi sequence.

As an embodiment of the invention, FIG. 7 shows a second pulse sequence type in the form of a Carr-Purcell-Freeman-Hill sequence (CPFH sequence) that is realized as a Trufi sequence. Analogous to FIG. 4, only the initial region of the sequence is reproduced. The sequence of radio-frequency pulses RF is shown on the axis 52, and the gradient pulses Gs, Gp, Gr for spatial coding are shown on the axes 54, 56, 58. In this embodiment as well, the bSSFP sequence is applied in two variants in order to generate the desired direction of the initial magnetization. In the first variant of this bSSFP sequence, the magnetization is initially flipped by α/2 in the positive x-direction. An alternating flip of the magnetization by the angle α in the negative x-direction and positive x-direction subsequently takes place. In the second variant of the CPFH sequence, a preparation of the magnetization by 180°−α/2 takes place. Just as in the first bSSFP sequence, flipping by the angle α in the negative and positive x-directions occur in alternation.

In a modification to the second variant of the CPFH sequence that is described above, an alternative second variant is generated from the first variant by prefixing an inversion pulse with subsequent spoiler pulse. This alternative can be regarded as an inversion recovery Trufi with minimal inversion time and is particularly advantageous if the flip angle α is much smaller than 180°.

Figure 8:
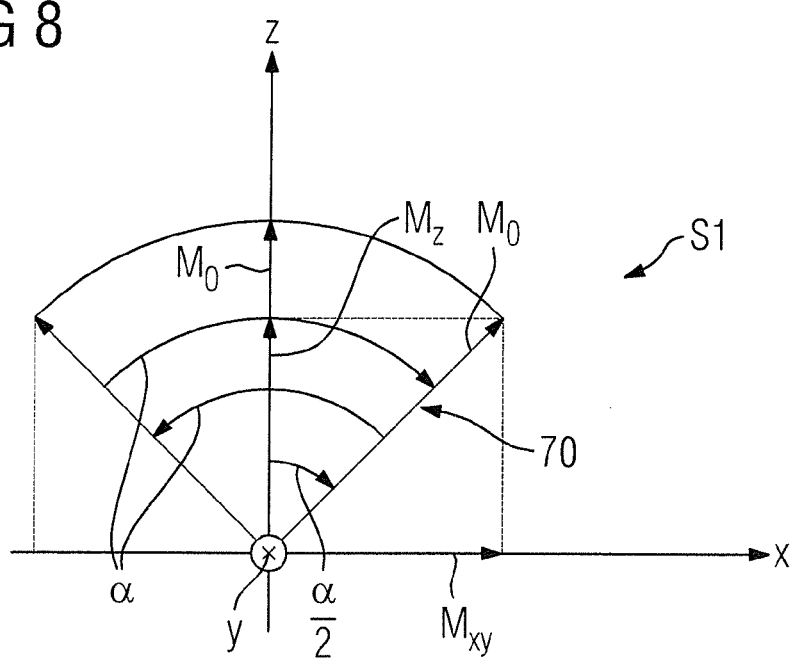
FIG. 8 shows the various spatial attitudes of the magnetization vector for a Trufi sequence with a first preparation pulse.
Figure 9:
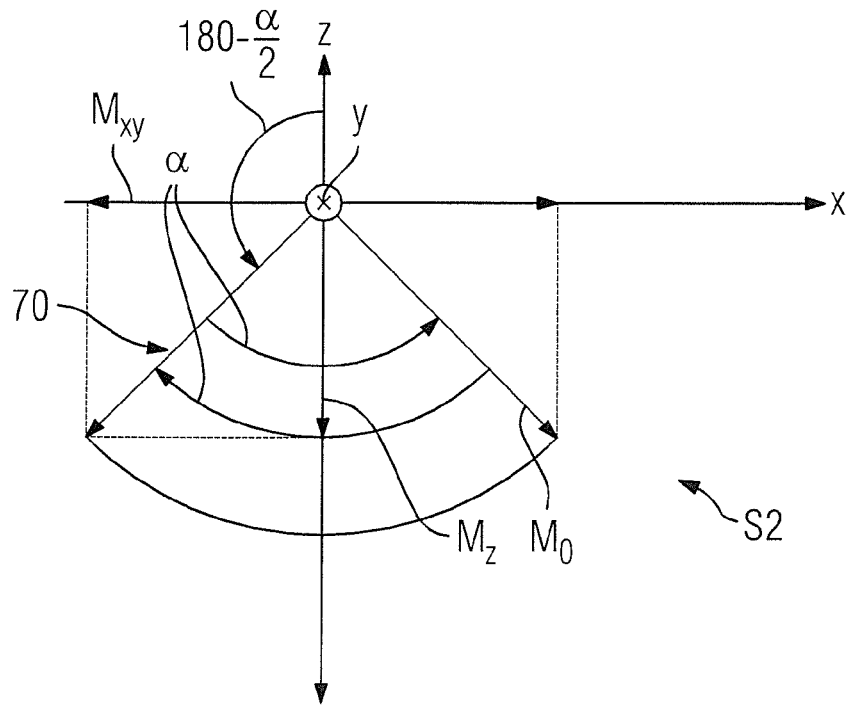
FIG. 9 shows the various spatial attitudes of the magnetization vector for a Trufi sequence with a second preparation pulse.

The initial magnetization appearing given this sequence type is shown in FIG. 8 for the first variant and FIG. 9 for the second variant, given a refocusing angle 62 of less than 180°. In both FIGS. 8 and 9, the magnetization $M_0$ is flipped into a first position 70 with the preparation pulse due to the basic magnetic field $B_0$. The transverse magnetization $M_{xy}$ that then arises is positive given the first bSSFP sequence and negative given the second bSSFP sequence, such that the constructive superimposition takes place by means of a subtraction.

If the initial magnetization is flipped in the negative x-direction by the preparation pulse in the first bSSFP sequence instead of in the positive x-direction and the second bSSFP sequence is left unchanged, a constructive superimposition is then formed via addition.

Figure 10:
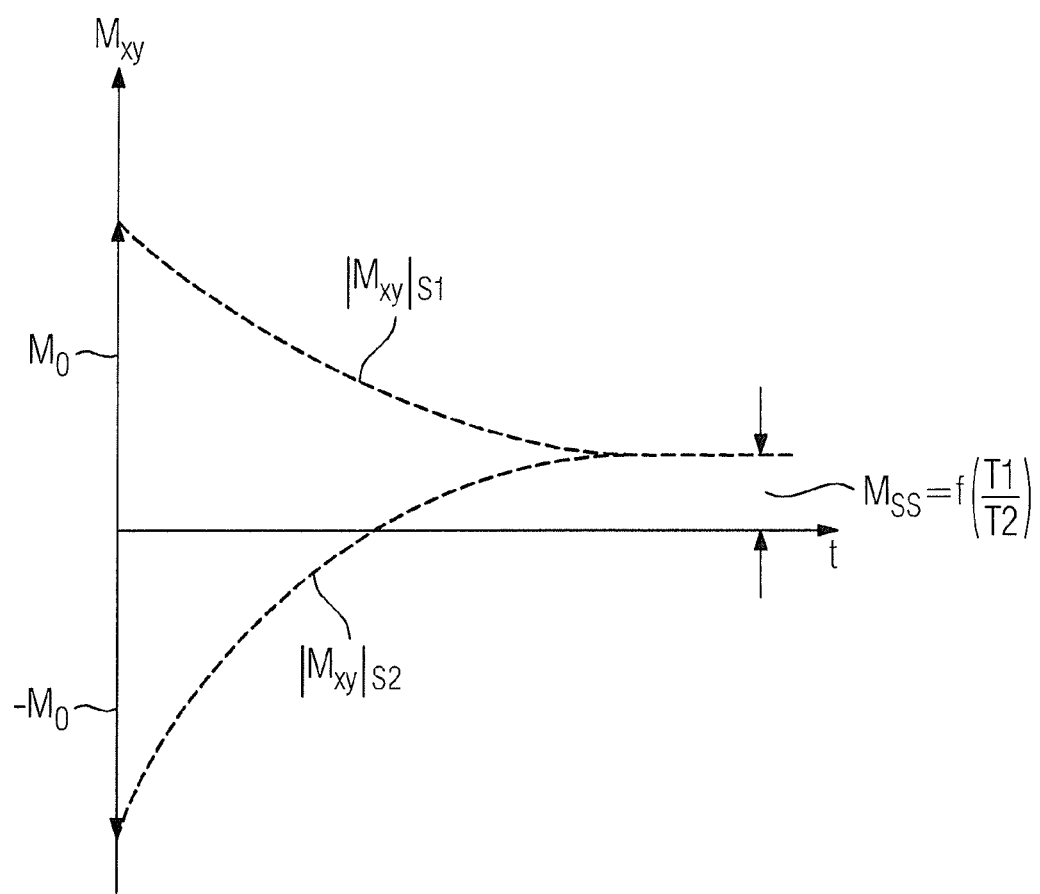
FIG. 10 shows the curve of the transverse magnetization of the first and second Trufi sequences.

FIG. 10 shows the time curve of the magnitude of the transverse magnetization $M_{xy}$ given the pulse sequence type according to FIG. 7 for both the first variant and the second variant of the bSSFP sequence. Both bSSFP sequences proceed counter to an identical stationary magnetization $M_{SS}$ given different initial magnetization that is compensated by the constructive superimposition.

A spatially resolved, quantitative estimation of the T2 constants can also be implemented with the sequences described in detail. For this, T2-weighted image data of the imaging area are generated with the described method at two different echo times. The T2 constants are then estimated from the two image data via the known correlation of the exponentially decaying signal response. The estimation is more precise the smaller the T1 contrast in the signals. The precision of the T2 estimation is determined by the following boundary conditions. In general, the effective decay constant is a function of flip angle, T1 and T2, wherein the ratios $R1=1/T1$ and $R2=1/T2$ geometrically add corresponding to the average magnetization direction. This is different for the two sequence types CPMG and CPFH. However, an estimate of this influence shows only slight deviations. T1/T2~15 . . . 20 for myocardium; therefore, the influence of T1 is slight for typical flip angles (for example 70°/2) and can be ignored in the contrast calculation. However, a possible influence of T1 is also not critical since a T1 extension leads to an extension of the decay constants, and therefore to a positive contrast for the pathological tissue. In acquisition planning, it is to be taken into account that the decay rate is reduced to approximately ⅓ (sin(35 deg)^2) in the case of CPFH.

The preceding examples refer to a 2D data acquisition, thus slice image data. However, the principle that is thereby applied can also easily be applied to a 3D data acquisition.

The data acquisition can be further accelerated with multiple measures. The partial Fourier technique (known per se), in which essentially only somewhat more than half of k-space is populated with data, suggests itself. The missing and unmeasured data are reconstructed utilizing the symmetry response of the signals.

An additional acceleration of the data acquisition can be achieved by means of known post-processing apparatus techniques. The spatially different sensitivity ranges of multiple reception coils are thereby utilized for additional spatial coding of the magnetic resonance signals.

Since a complete data acquisition of the beating heart at high resolution is not feasible even with the bSFFP sequences, which are inherently quite fast, the magnetic resonance signals are often acquired over multiple cardiac phases, advantageously in the phases of relative rest of the heart. The data acquisition then takes place triggered with a characteristic signal in a cardiac cycle. In order to achieve a stronger T2 weighting, and in order to avoid possible transient artifacts, the bSFFP sequence can also already be started earlier in the movement phase. It is thus advantageous to use the spatial coding or k-space coding of the first line to be read out for the preparation of the T2 weighting.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to generate spatially resolved, quasi-T2-weighted magnetic resonance signals from an examination region of a subject, comprising:
   operating a magnetic resonance data acquisition unit with a first gradient-balanced SSFP sequence in which an initial magnetization in the subject is flipped in a first direction;
   operating said magnetic resonance data acquisition unit to detect spatially coded first magnetic resonance signals from the first gradient-balanced SSFP sequence during a transient portion of said first gradient-balanced SSFP sequence;
   operating said magnetic resonance data acquisition unit with a second gradient-balanced SSFP sequence with which said initial magnetization is flipped in a direction opposite said first direction, said second gradient-balanced SSFP sequence being of a same sequence type as said first gradient-balanced SSFP sequence;
   operating said magnetic resonance data acquisition unit to detect spatially coded second magnetic resonance signals from said gradient-balanced SSFP sequence during a transient portion of said second gradient-balanced SSFP sequence;
   in a computerized processor, constructively superimposing said first and second magnetic resonance signals to form overlay signals; and
   in said processor, processing said overlay signals into image data with a predominant T2 weighting or for spatially resolved estimation of a T2 relaxation time constant, and making said image data or said T2 estimation of said T2 relaxation time constant available at an output of said processor.

2. A method as claimed in claim 1 comprising constructively superimposing said first and second magnetic resonance signals by adding said first and second magnetic resonance signals, if said first and second magnetic resonance signals initially have an identical phase position.

3. A method as claimed in claim 1 comprising constructively superimposing said first and second magnetic resonance signals by forming a difference between said first and second magnetic resonance signals, if said first and second magnetic resonance signals initially have an opposite phase position.

4. A method as claimed in claim 1 comprising producing said first direction of said initial magnetization by a first preparation pulse in said first gradient-balanced SSFP sequence, and producing said second direction of said initial magnetization with a second preparation pulse in said second gradient-balanced SSFP sequence, with each of said first and second preparation pulses being followed in the respective first and second gradient-balanced SSFP sequences by identical excitation pulses.

5. A method as claimed in claim 4 wherein said preparation pulse in said second gradient-balanced SSFP sequence comprises a 180° inversion pulse with a subsequent spoiler pulse.

6. A method as claimed in claim 1 wherein said first and second gradient-balanced SSFP sequences are of the CARR-Purcell-Meiboom-Gill sequence type.

7. A method as claimed in claim 1 wherein said first and second gradient-balanced SSFP sequences are of the CARR-Purcell-Freeman-Hill sequence type.

8. A method as claimed in claim 1 comprising producing a flip angle of said magnetization in said first gradient-balanced SSFP sequence that is half of a subsequent refocusing flip angle and wherein a value of said first flip angle in said second gradient-balanced SSFP sequence is equal to 180° minus half of said subsequent refocusing flip angle.

9. A method as claimed in claim 1 comprising processing said first and second magnetic resonance signals using a partial Fourier technique.

10. A method as claimed in claim 1 comprising generating and processing said first and second magnetic resonance signals using a partially parallel acquisition technique.

11. A method as claimed in claim 1 wherein said examination area exhibits a periodic movement, and comprising triggering acquisition of said first and second magnetic resonance signals dependent on said movement.

12. A method as claimed in claim 11 comprising starting signal acquisition with each of said first and second gradient-balanced SSFP sequences in a movement phase and acquiring said first and second magnetic resonance signals in a phase of relative rest of said movement.

13. A method as claimed in claim 12 comprising acquiring said first and second magnetic resonance signals over a plurality of cycles of said movement in segmented k-space according to the pairing principle.

14. A device to generate spatially resolved, quasi-T2-weighted magnetic resonance signals from an examination region of a subject, comprising:
   a magnetic resonance data acquisition unit operated by a control unit;
   said control unit being configured to operate a magnetic resonance data acquisition unit with a first gradient-balanced SSFP sequence in which an initial magnetization in the subject is flipped in a first direction;
   said control unit being configured to operate said magnetic resonance data acquisition unit to detect spatially coded first magnetic resonance signals from the first gradient-balanced SSFP sequence during a transient portion of said first gradient-balanced SSFP sequence;
   said control unit being configured to operate said magnetic resonance data acquisition unit with a second gradient-balanced SSFP sequence with which said initial magnetization is flipped in a direction opposite said first direction, said second gradient-balanced SSFP sequence being of a same sequence type as said first gradient-balanced SSFP sequence;
   said control unit being configured to operate said magnetic resonance data acquisition unit to detect spatially coded second magnetic resonance signals from said gradient-balanced SSFP sequence during a transient portion of said second gradient-balanced SSFP sequence;
   a computerized processor configured to constructively superimpose said first and second magnetic resonance signals to form overlay signals; and
   said processor being configured to process said overlay signals into image data with a predominant T2 weighting or for spatially resolved estimation of a T2 relaxation time constant, and making said image data or said estimation of said T2 relaxation time constant available at an output of said processor.

* * * * *